(12) United States Patent
Zhang et al.

(10) Patent No.: US 12,069,887 B2
(45) Date of Patent: Aug. 20, 2024

(54) LAMINATED STRUCTURE AND PREPARATION METHOD THEREOF, LED AND PREPARATION METHOD THEREOF

(71) Applicant: TCL TECHNOLOGY GROUP CORPORATION, Guangdong (CN)

(72) Inventors: Tao Zhang, Guangdong (CN); Chaoyu Xiang, Guangdong (CN); Pei Zhu, Guangdong (CN); Zhitian Luo, Guangdong (CN)

(73) Assignee: TCL TECHNOLOGY GROUP CORPORATION, Guangdong (CN)

( * ) Notice: Subject to any disclaimer, the term of this patent is extended or adjusted under 35 U.S.C. 154(b) by 538 days.

(21) Appl. No.: 17/419,580

(22) PCT Filed: Sep. 26, 2019

(86) PCT No.: PCT/CN2019/108156
§ 371 (c)(1),
(2) Date: Jun. 29, 2021

(87) PCT Pub. No.: WO2020/134253
PCT Pub. Date: Jul. 2, 2020

(65) Prior Publication Data
US 2022/0069256 A1    Mar. 3, 2022

(30) Foreign Application Priority Data
Dec. 29, 2018 (CN) .......................... 201811633012.2

(51) Int. Cl.
*H10K 50/844* (2023.01)
*H10K 71/00* (2023.01)
*H10K 102/00* (2023.01)

(52) U.S. Cl.
CPC ......... *H10K 50/8445* (2023.02); *H10K 71/00* (2023.02); *H10K 2102/00* (2023.02); *H10K 2102/351* (2023.02)

(58) Field of Classification Search
CPC ........... H10K 50/8445; H10K 2102/00; H10K 2102/351; H10K 50/115; H10K 71/00; H10K 71/40
See application file for complete search history.

(56) References Cited

U.S. PATENT DOCUMENTS

| 10,784,464 B2 | 9/2020 | Jin et al. | |
| 2010/0255344 A1* | 10/2010 | Kim | H01L 21/268 |
| | | | 428/697 |

(Continued)

FOREIGN PATENT DOCUMENTS

| CN | 102209628 A | 10/2011 |
| CN | 102299265 A | 12/2011 |

(Continued)

OTHER PUBLICATIONS

International Search Report for International Application No. PCT/CN2019/108156; International Filing Date: Sep. 26, 2019; Date of Mailing: Dec. 27, 2019; 3 pages.

(Continued)

*Primary Examiner* — Wasiul Haider

(57) ABSTRACT

A laminated structure which at least includes one laminated unit, the lamination unit includes: a first metal oxide layer and a second metal oxide layer which are oppositely arranged, and a third metal layer arranged between the first metal oxide layer and the second metal oxide layer, and a third metal oxide film is respectively formed between the first metal oxide layer and the third metal layer, and between the second metal oxide layer and the third metal layer.

14 Claims, 2 Drawing Sheets

(56) References Cited

U.S. PATENT DOCUMENTS

2011/0212336 A1* 9/2011 Kawamoto .......... H05K 9/0096
  204/192.15
2013/0045374 A1 2/2013 Yu et al.

FOREIGN PATENT DOCUMENTS

| CN | 103178077 A | 6/2013 |
| CN | 104183747 A | 12/2014 |
| CN | 106784380 A | 5/2017 |
| CN | 107658389 A | 2/2018 |
| JP | H10275680 A | 10/1998 |
| JP | 2017111886 A | 6/2017 |
| WO | 2020134253 A1 | 7/2020 |

OTHER PUBLICATIONS

Written Opinion for International Application No. PCT/CN2019/108156; International Filing Date: Sep. 29, 2019; Date of Mailing: Dec. 27, 2019; 3 pages.

* cited by examiner

US 12,069,887 B2

LAMINATED STRUCTURE AND PREPARATION METHOD THEREOF, LED AND PREPARATION METHOD THEREOF

CROSS-REFERENCE TO RELATED APPLICATIONS

This application is a national phase entry of International Application No. PCT/CN2019/108156, filed on Sep. 26, 2019, which is based upon and claims priority to Chinese Patent Application No. 201811633012.2, filed on Dec. 29, 2018, the entire contents each of which are incorporated herein by reference.

TECHNICAL FIELD

The present disclosure relates to the technical field of displaying, and particularly to a laminated structure and a preparation method thereof, LED and a preparation method thereof.

BACKGROUND

Quantum dots have the advantages of easily adjustable color of emitted light, high color saturation, being simple in process, high stability and the like, and is a strong competitor of the next generation display technology. Preparing QLED (Quantum Dot Light Emitting Diode) on flexible substrate to realize flexible display is an important direction of the current development of display. At present, the realization of flexible QLED still faces many challenges, especially on TFE (Thin Film Encapsulation) technology, because QLED is more sensitive to moisture in the air, the penetrated moisture is prone to react with active metal cathode or some materials for transmission, thereby causing a reduced device performance. Moreover, in order to ensure the flexibility of the flexible QLED device, a high-molecular polymer is usually selected as a substrate, this substrate has a poorer moisture barrier capability, so that permeation of moisture is prone to occur. As a result, seeking for a good TFE technology has great significance on improving the stability of the device and expanding the present disclosure scenario of the flexible QLED.

Currently, the most commonly used TFE method is to combine organic thin film with inorganic thin film to form an encapsulated barrier layer, which is also called a Barix encapsulation technology, wherein the inorganic thin film is the real barrier layer, and the organic thin film is mainly used for improving flatness and reducing mechanical damage. Although this technique may ensure a lower moisture permeability, a thicker thickness of organic thin film is still required to compensate pinhole defect of the inorganic thin film, thus, the cost is high. ALD (Atomic Layer Deposition) method developed in recent years is used to form thin film encapsulation, although a lower moisture penetration rate may be realized over a thinner thickness, it is still difficult to apply this thin film encapsulation method in mass production due to slow growth cycle.

Technical Problem

Embodiments of the present disclosure provide a laminated structure and a preparation method thereof, and a light-emitting diode including the laminated structure and a preparation method thereof, which aims at solving the problems that, in the existing technology of combining an organic film with an inorganic film to form an encapsulated barrier layer, in order to ensure moisture isolation effect, either the thickness of the organic thin film is increased and a high cost is caused, or thin film is prepared using an atomic layer deposition method, which is difficult to be applied in mass production due to low growth cycle.

TECHNICAL SOLUTION

Embodiments of the present disclosure are implemented in this way: in the first aspect, a laminated structure is provided, the laminated structure at least includes a laminated unit, the laminated unit includes a first metal oxide layer and a second metal oxide layer which are oppositely arranged, and a third metal layer arranged between the first metal oxide layer and the second metal oxide layer, and a third metal oxide film is respectively formed between the first metal oxide layer and the third metal layer, and between the second metal oxide layer and the third metal layer.

In a second aspect, a method for preparing a laminated structure is provided, the laminated structure includes at least one laminated unit, and the laminated unit includes a first metal oxide layer and a second metal oxide layer which are oppositely arranged, and a third metal layer arranged between the first metal oxide layer and the second metal oxide layer, and a third metal oxide film is respectively formed between the first metal oxide layer and the third metal layer, and between the second metal oxide layer and the third metal layer, preparation method of the laminated structure includes following steps of:

providing a substrate, preparing the first metal oxide layer on the substrate, preparing the third metal layer on the first metal oxide layer, and preparing the second metal oxide layer on the third metal layer, thereby obtaining a prefabricated laminated unit; and performing a heat treatment process on the prefabricated laminated unit to prepare the laminated unit.

In a third aspect, an LED is provided, the LED includes an anode and a cathode which are oppositely arranged, a luminescent layer arranged between the anode and the cathode, and an encapsulated structure arranged on a surface of the anode and/or the cathode, wherein the encapsulated structure is the laminated structure in the present disclosure.

In a fourth aspect, a method for preparing an LED is provided, this method includes the following steps of:

preparing an anode and a cathode which are oppositely arranged, and arranging a luminescent layer between the anode and the cathode; and preparing an encapsulated structure on a surface of the anode and/or the cathode according to the method for preparing laminated structure in the present disclosure.

The laminated structure provided by the present disclosure at least includes a laminated unit, wherein the laminated unit includes a first metal oxide layer and a second metal oxide layer which are arranged oppositely, and a third metal layer arranged between the first metal oxide layer and the second metal oxide layer, and a third metal oxide film is respectively formed between the first metal oxide layer and the third metal layer, and between the second metal oxide layer and the third metal layer. That is, the laminated unit is a laminated unit of $M_1O/Al_2O_3/Al/Al_2O_3/M_2O$, wherein $M_1O$ is the the first metal oxide layer, $M_2O$ is the second metal oxide layer.

First, in this laminated unit, the third metal oxide film serves as the main barrier layer and provides good water oxygen barrier property, and can be taken as an encapsulated structure for effectively isolating water oxygen; meanwhile, some defects of the third metal oxide film (i.e., the middle layer) can be filled due to its good ductility and uniformity, and the water oxygen barrier property of the encapsulated structure is further ensured. The nano-metal oxide in the metal oxide layer can absorb water, so that a small amount of permeated moisture is restrained in the nano-metal oxide, and a multi-layer moisture isolation effect is achieved.

Second, since the materials in the laminated structure, such as the third metal layer, the metal oxide layer and the third metal oxide film have an excellent heat conduction effect, when the laminated structure serves as the encapsulated structure of a heating device, the heat generated by radiation in the device can be effectively conducted to the external environment, and the stability of the device is effectively improved.

Additionally, the materials of the laminated structure provided by the present disclosure are compatible with the materials for preparing conventional luminescent device, and have the advantage of low cost.

According to the method for preparing laminated structure provided by the present disclosure, the laminated structure can be prepared only by laminating the first metal oxide layer, the third metal layer and the second metal oxide layer sequentially, and then performing heat treatment process on the laminated structure, this method is compatible with the process of the conventional luminescent device, and has the advantages of being simple in operation and being low in cost, and is suitable for mass industrial production.

According to the LED provided by the present disclosure, the encapsulated structure of the present disclosure is arranged on the surface of the anode or the cathode, the encapsulated structure can effectively isolate water oxygen from entering the components of the light-emitting diode, and improves heat conduction effect of the LED simultaneously, and thereby improves the stability of components of the LED.

According to the method for preparing LED, it only needs to further prepare the encapsulated structure on the basis of the conventional preparation method, this method is simple and controllable, and is suitable for mass industrial production.

DETAILED DESCRIPTION OF THE EMBODIMENTS

Figure 1:
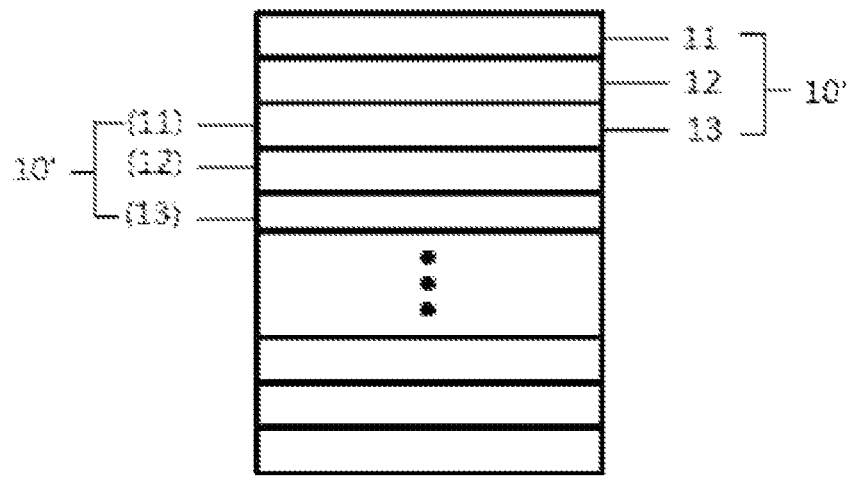
FIG. 1 illustrates a schematic diagram of a laminated structure including a prefabricated laminated unit according to one embodiment of the present disclosure.

In order to make the purpose, the technical solutions and the advantages of the present disclosure be clearer and more understandable, the present disclosure will be further described in detail below with reference to accompanying figures and embodiments. It should be understood that the embodiments described in detail herein are merely intended to illustrate but not to limit the present disclosure.

In addition, terms "the first" and "the second" are only used in describe purposes, and should not be considered as indicating or implying any relative importance, or impliedly indicating the number of indicated technical features. As such, technical feature(s) restricted by "the first" or "the second" can explicitly or implicitly comprise one or more such technical feature(s). In the description of the present disclosure, "a plurality of" means two or more, unless there is additional explicit and specific limitation.

One embodiment of the present disclosure provides a laminated structure which at least includes a laminated unit, wherein the laminated unit includes a first metal oxide layer and a second metal oxide layer which are oppositely arranged, and a third metal layer arranged between the first metal oxide layer and the second metal oxide layer, and a third metal oxide film is formed between the first metal oxide layer and the third metal layer and between the second metal oxide layer and the third metal layer, respectively.

Optionally, a third metal in the third metal layer and the third metal oxide film are the metal that can react with oxygen to form a third metal oxide, this metal can be such as Al, Mg, Ag, or the like. It needs to be noted that, the third metal oxide film may either be formed by reaction of the first metal oxide layer and the third metal layer, or be formed by reaction of the second metal oxide layer and the third metal layer, the third metal oxide film may also be directly deposited between the first metal oxide layer and the third metal layer or deposited between the second metal oxide layer and the third metal layer.

The laminated structure provided by the embodiment of the present disclosure at least includes one laminated unit, the laminated unit includes the first metal oxide layer and the second metal oxide layer which are oppositely arranged, and the third metal layer arranged between the first metal oxide layer and the second metal oxide layer, and the third metal oxide film is respectively formed between the first metal oxide layer and the third metal layer, and between the second metal oxide layer, taking the third metal layer as Al for example, the laminated unit has a laminated structure of $M_1O/Al_2O_3/Al/Al_2O_3/M_2O$, wherein $M_1O$ is the first metal oxide layer, $M_2O$ is the second metal oxide layer, the third metal oxide film $Al_2O_3$ may be formed by reaction of the first metal oxide layer and the third metal layer Al or be formed by reaction of the second metal oxide layer and the third metal layer Al, the third metal oxide film $Al_2O_3$ can also be directly deposited between the first metal oxide layer and the third metal layer or deposited between the second metal oxide layer and the third metal layer, that is, the third metal oxide film $Al_2O_3$ is deposited by chemical deposition method or physical deposition method.

First, in this laminated unit, the third metal oxide film serves as the main barrier layer and provides good water oxygen barrier property, and can be taken as an encapsulated structure for effectively isolating water oxygen; meanwhile, some defects of the third metal oxide film (i.e., the middle layer) can be filled due to its good ductility and uniformity, and the water oxygen barrier property of the encapsulated structure is further ensured. The nano-metal oxide in the metal oxide layer can absorb water, so that a small amount of permeated moisture is restrained in the nano-metal oxide, and a multi-layer moisture isolation effect is achieved.

Second, since the materials in the laminated structure, such as the third metal layer, the metal oxide layer and the third metal oxide film have an excellent heat conduction effect, when the laminated structure serves as the encapsulated structure of a heating device, the heat generated by radiation in the device can be effectively conducted to the external environment, and the stability of the device is effectively improved.

Additionally, the materials of the laminated structure provided by the present disclosure are compatible with the materials for preparing conventional luminescent device, and have the advantage of low cost.

In particular, the metal oxide layer in the laminated structure serves as one of the functional layers, and are taken as two end surfaces of the laminated structure respectively, in one aspect, the metal oxide layer is used for providing oxygen vacancies and forming the third metal oxide film that can isolate water oxygen by reacting with the third metal layer of the middle metal layer; in another aspect, since the metal oxide layer can absorb water, a small amount of moisture that permeates into the metal oxide layer is restrained in the metal oxide layer, so that the moisture isolation effect is further improved.

In this embodiment of the present disclosure, the first metal oxide layer is selected from nano-metal oxide and/or doped nano-metal oxide; and the material of the second metal oxide layer is selected from nano-metal oxide and/or doped nano-metal oxide.

In some embodiments, the material of the first metal oxide layer is selected from at least one of nano-zinc oxide, nano-nickel oxide, doped nano-nickel oxide, nano-molybdenum oxide, doped nano-molybdenum oxide. In some embodiments, the material of the second metal oxide layer is selected from at least one of nano-zinc oxide, doped nano-zinc oxide, nano-nickel oxide, doped nano-nickel oxide, nano-molybdenum oxide, and doped nano-molybdenum oxide. The preferable metal oxide material is good in thermal conductivity, and is not prone to easily generate oxygen diffusion on the interface, so that the preferable metal oxide material is facilitated to react with the middle metal layer and the third metal layer to generate the third metal oxide film that can isolate water oxygen; moreover, the preferable metal oxide material can absorb water, so that the moisture isolation effect is further improved. In addition, the metal oxide material is prone to be printed, and has excellent film formability.

In a preferable embodiment, the metal oxide in the first metal oxide layer is identical to the metal oxide in the second metal oxide layer, so that a laminated structure with higher stability is obtained.

On the basis of the aforesaid embodiment, the doped material in the doped nano-metal oxide is selected from metal materials. Specifically, the metal materials are selected from the metals which are prone to react with oxygen, and the metal oxide generated by the reaction has excellent oxygen barrier capability. In a preferable embodiment, the doped material is selected from at least one of magnesium, aluminum, manganese and silver. Wherein the magnesium, aluminum, manganese, silver are prone to react with oxygen, and the metal oxide generated by the reaction has excellent water oxygen barrier capability.

In this embodiment of the present disclosure, the size of each metal oxide nanoparticle in the metal oxide layer (including the first metal oxide layer and the second metal oxide layer) is smaller than 5 nanometers, so that the density of the film layer is ensured.

In this embodiment of the present disclosure, the first metal oxide layer has a thickness of 10-30 nanometers, preferably. The second metal oxide layer has a thickness of 10-20 nanometers. If the film layer of the metal oxide layer is too thin, the formed film layer is not dense enough, there will be more pinhole defects; if the film layer of the metal oxide layer is too thick, material is wasted, meanwhile, the light transmittance of the encapsulation layer is reduced when the laminated structure is used as the encapsulation layer.

The third metal layer serves as an another functional layer, and can react with the oxygen vacancy of the metal oxide to generate the third metal oxide film that isolates water oxygen. Meanwhile, the third metal layer has better thermal conductivity and excellent ductility. When the third metal layer is used as the encapsulated structure, not only some defects of the third metal oxide film (i.e., the middle layer) can be effectively compensated, the water oxygen barrier property of the encapsulated structure can also be further ensured; moreover, it is more convenient to conduct heat generated in the device due to radiation to the external environment, the device stability is effectively improved.

In some embodiments, the third metal layer and the third metal in the third metal oxide film are selected from at least one of a group consisting of aluminum, magnesium and silver. In this situation, in the laminated unit, the third metal oxide film serves as the main barrier layer which provides good water oxygen barrier capability, and can be used as the encapsulated structure for effectively isolating water oxygen; meanwhile, since the third metal layer has good ductility and uniformity, some defects of the third metal oxide film (i.e., middle layer) can be effectively repaired, the water oxygen barrier property of the encapsulated structure is further ensured. While the nano-metal oxide in the metal oxide layer can absorb water, so that a small amount of permeated moisture can be restrained in the nano-metal oxide to realize multi-layer moisture isolation effect.

In some embodiments, the third metal layer has a thickness of 10-20 nanometers. If the thickness of the third metal layer is too thin, the formed film layer is poor in quality, hole is prone to occur and moisture permeation channel is formed accordingly, and the function of repairing the defect of the metal oxide layer cannot be achieved; if the thickness of the third metal layer is too thick, the light transmittance of the encapsulation layer can be reduced when the laminated structure is used as the encapsulation layer.

In this embodiment of the present disclosure, the third metal oxide film is actually a functional layer for isolating water oxygen and this functional layer is formed by the reaction between the adjacent third metal layer and the metal oxide layer. In some embodiments, the third metal oxide film has a thickness of 2-5 nanometers, in this case, a better water oxygen isolation effect can be achieved.

According to the embodiment of the present disclosure, the laminated structure at least includes one laminated unit, and the number of the laminated units is determined according to the thickness of the laminated unit and moisture permeability that needs to be achieved by the encapsulated device. The better the required sealing performance of the encapsulated device, the greater the number of the laminated units. In some embodiments, the laminated structure includes 1-10 repeatedly arranged laminated units. As one specific embodiment, at least more than 3 repeatedly arranged laminated units are required when the moisture permeability that needs to be achieved by the encapsulated device is $1 \times 10^{-6}$ g/m$^2$/day.

It is worth noting that when 2 or more than 2 laminated units are included in the laminated structure, and the material of the first metal oxide layer is identical to the material of the second metal oxide layer, those adjacent metal oxide layers can be combined into one layer.

The thin layer structure in the embodiment of the present disclosure can be prepared by the following method.

Figure 2:
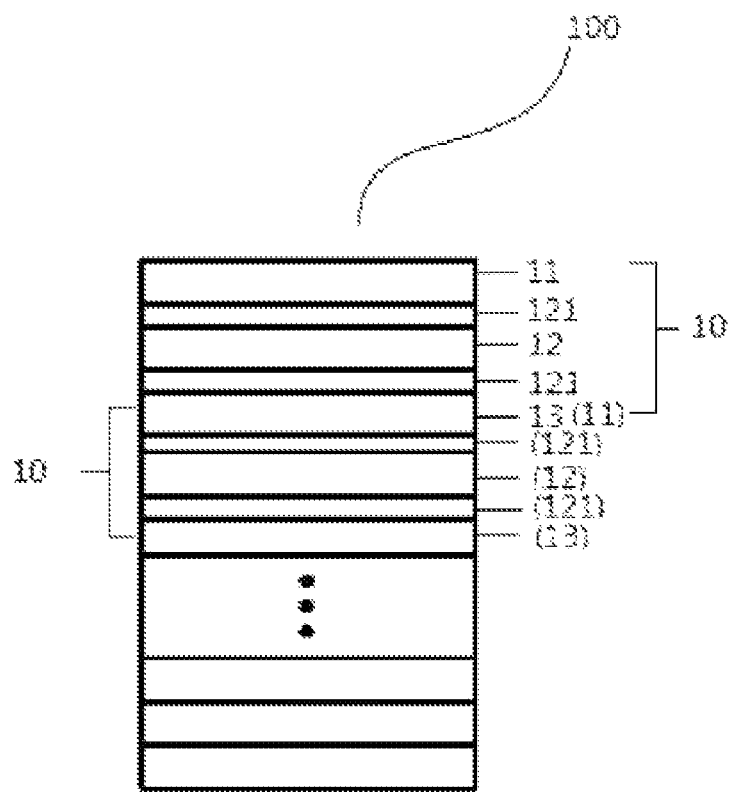
FIG. 2 illustrates a schematic diagram of a laminated structure including a laminated unit according to one embodiment of the present disclosure.
Figure 3:
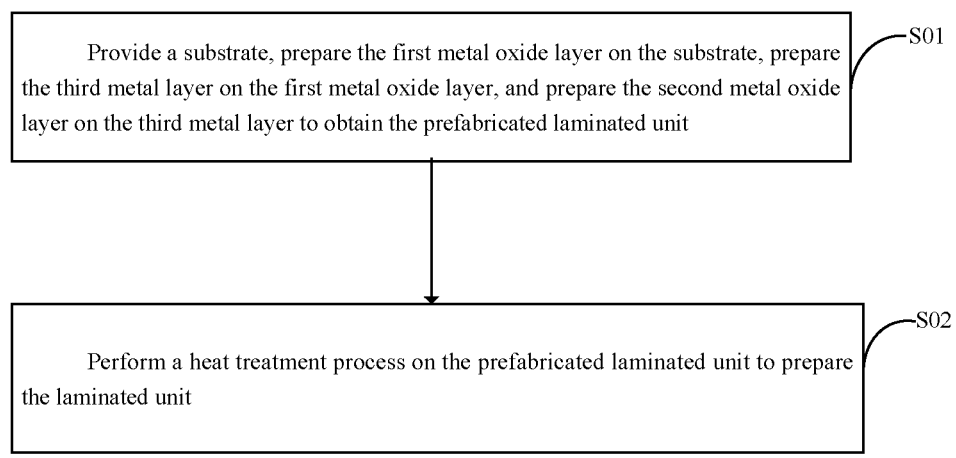
FIG. 3 illustrates a schematic flowchart of a method for fabricating laminated structure according to one embodiment of the present disclosure.

Correspondingly, as shown in FIG. 1 and FIG. 2, one embodiment of the present disclosure provides a method for preparing a laminated structure, the laminated structure shown in FIG. 2 at least includes one laminated unit 10, the laminated unit includes a first metal oxide layer 11 and a second metal oxide layer 13 which are oppositely arranged, and a third metal layer 12 arranged between the first metal oxide layer 11 and the second metal oxide layer 13, and a third metal oxide film 121 is respectively formed between the first metal oxide layer 11 and the third metal layer 12, and between the second metal oxide layer 13 and the third metal layer 12. As shown in FIG. 3, the method for preparing the laminated structure according to this embodiment of the present disclosure includes the following steps:

in a step of S01, providing a substrate, preparing the first metal oxide layer 11 on the substrate, preparing the third metal layer 12 on the first metal oxide layer 11, and preparing the second metal oxide layer 13 on the third metal layer 12, thereby obtaining a prefabricated laminated unit 10', as shown in FIG. 1;

In a step of S02, performing a heat treatment process on the prefabricated laminated unit 10' to obtain the laminated unit 10.

According to the method of preparing laminated structure provided by this embodiment of the present disclosure, the laminated structure can be prepared only by laminating the first metal oxide layer, the third metal layer and the second metal oxide layer sequentially, and performing heat treatment process on the laminated structure. The method is compatible with the conventional luminescent devices, and has the advantages of being simple in operation and being low in cost, and thus is suitable for mass industrial production.

Specifically, in the step of S01, the substrate is the component that is needed for preparing the encapsulated structure, which can be such as an LED (Light Emitting Diode). The first metal oxide layer 11 is prepared on the substrate. In some embodiments, preparing the first metal oxide layer 11 on the substrate is realized by using ink-jet printing technology; the third metal layer 12 is prepared on the first metal oxide layer 11, in some embodiments, preparing the third metal layer 12 on the first metal oxide layer 11 is realized by using a vacuum evaporation technique; the second metal oxide layer 13 is prepared on the third metal layer 12. In some embodiments, preparing the second metal oxide layer 13 on the third metal layer 12 is realized by using the ink-jet printing technique. A structure having the prefabricated laminated unit 10' as shown in FIG. 1 is obtained by sequentially preparing the first metal oxide layer 11, the third metal layer 12 and the second metal oxide layer 13 on the substrate. The structure obtained by the aforesaid method has excellent water oxygen barrier property, either.

In a step of S02, the heat treatment process is performed on the prefabricated laminated unit 10', so that the metal oxide in the first metal oxide layer 11 is enabled to react with the aluminum in the third metal layer 12, and the metal oxide in the second metal oxide layer 13 is enabled to react with the aluminum in the third metal layer 12, the third metal oxide film 121 is formed between the metal oxide and the third metal layer, and the laminated structure having the laminated unit 10 as shown in FIG. 2 is obtained.

In some embodiments, the heat treatment process is performed on the prefabricated laminated unit under the temperature condition of 100-140° C., the time duration of the heat treatment is 0.5-2 hours. In this condition, not only can a reaction of the metal oxide in the first metal oxide layer 11 and the aluminum in the third metal layer 12 be effectively promoted, the quality of the functional layers would not be affected due to too high temperature.

According to the actual requirement, the method provided by this embodiment of the present disclosure further includes: repeatedly preparing the third metal layer and the metal oxide layer on the surface of at least one metal oxide layer of the prefabricated laminated unit, and performing heat treatment process on the obtained laminated structure to prepare the laminated structure having a plurality of laminated units.

It is worth noting that, when the step of repeatedly preparing the third metal layer and the metal oxide layer on the surface of the at least one metal oxide layer of the prefabricated laminated unit is performed, the metal oxide layer used for repeatedly preparing the third metal layer and the metal oxide layer has a thickness of 20-40 nanometers, which ensures that there are enough metal oxides that can simultaneously react with the third metal layer of the upper layer and the third metal layer of the lower layer to form the third metal oxide film with a proper thickness.

One embodiment of the present disclosure further provides an LED (Light Emitting Diode). The LED includes an anode and a cathode which are oppositely arranged, a luminescent layer arranged between the anode and cathode, and an encapsulated structure arranged on a surface of the anode and/or the cathode, wherein the encapsulated structure is the laminated structure according to the embodiments of the present disclosure.

According to the LED provided by the embodiment of the present disclosure, the encapsulated structure according to the embodiment of the present disclosure is arranged on the surface of the anode or the cathode, and the encapsulated structure can effectively isolate water oxygen from entering the components of the LED, and improves heat conduction effect of the LED, and thereby improves the stability of the components of the LED.

In this embodiment of the present disclosure, the LED is a quantum dot LED or an organic LED.

Specifically, the light emitting diode further includes a substrate, the substrate can be arranged on one end of the anode to form a forward LED, and the substrate can be arranged at one end of the cathode to form a reverse LED.

In some embodiments, the LED further includes a hole transmission layer arranged between the anode and the luminescent layer and at least one of hole injection layers. In some embodiments, the LED includes a hole transmission layer arranged between the anode and the luminescent layer. In some embodiments, the LED includes the hole injection layer arranged between the anode and the luminescent layer. In some embodiments, the LED includes a hole transmission layer arranged between the anode and the luminescent layer, and the hole injection layer arranged between the hole transmission layer and the luminescent layer.

In some embodiments, the LED further includes an electron transmission layer arranged between the cathode and the luminescent layer and at least one of electron injection layers. In some embodiments, the quantum dot LED includes an electron transmission layer arranged between the cathode and a quantum dot luminescent layer. In some embodiments, the quantum dot LED includes an electron injection layer arranged between the cathode and the quantum dot luminescent layer. In some embodiments, the quantum dot LED includes the electron transmission layer arranged between the cathode and the quantum dot luminescent layer and the electron injection layer arranged between the electron transmission layer and the luminescent layer.

There are some modes of arrangement of the laminated structure in the LED.

When the substrate is arranged at one end of the anode, that is, the LED is a forward LED, in some embodiments, the encapsulated structure is arranged on an end surface of the cathode, and the encapsulated structure is the laminated structure according to the embodiments of the present disclosure; in some embodiments, the encapsulated structure is arranged on a surface of the substrate away from the anode, and the encapsulated structure is the laminated structure according to the embodiments of the present disclosure; in some embodiments, an encapsulated structure is arranged on an end surface of the cathode, and an encapsulated structure is arranged on a surface of the substrate away from the anode, and the encapsulated structure is the laminated structure according to the embodiments of the present disclosure.

When the substrate can be arranged on one end of the cathode to form a reverse quantum dot LED, in some embodiments, the encapsulated structure is arranged on one end surface of the anode, and the encapsulated structure is the laminated structure according to the embodiments of the present disclosure; in some embodiments, the encapsulated structure is arranged on a surface of the substrate away from the cathode, and the encapsulated structure is the laminated structure according to the embodiments of the present disclosure; in some embodiments, one encapsulated structure is arranged on an end surface of the anode, and another encapsulated structure is arranged on a surface of the substrate away from the cathode, the encapsulated structure is the laminated structure according to the embodiments of the present disclosure.

The LED in this embodiment of the present disclosure can be prepared by the following method.

Accordingly, embodiments of the present disclosure provide a method for preparing an LED (Light Emitting Diode), which includes the following steps:

preparing an anode and a cathode which are oppositely arranged, and a luminescent layer arranged between the anode and the cathode;

preparing an encapsulated structure on a surface of the anode or the cathode according to method in the embodiment of the present disclosure.

According to the method of preparing LED provided by this embodiment of the present disclosure, it only needs to further prepare the encapsulated structure on the basis of the conventional preparation method, this method is simple and controllable, and is suitable for mass industrial production.

The conventional method can be used for preparation of anode, cathode and luminescent layer.

In some embodiments, the method for preparing LED further includes preparing at least one of hole transmission layer and hole injection layer between the anode and the luminescent layer. In some embodiments, the method for preparing LED includes preparing a hole transmission layer between the anode and the luminescent layer, and preparing a hole injection layer between the hole transmission layer and the luminescent layer.

In some embodiments, the method for preparing LED further includes preparing at least one of electron transmission layer and electron injection layer between the cathode and the luminescent layer. In some embodiments, the method for preparing LED includes preparing an electron transmission layer between the cathode and the luminescent layer, and preparing an electron injection layer between the electron transmission layer and the luminescent layer.

The encapsulated structure is prepared on the surface of the anode or the cathode, and the encapsulated structure prepared on the surface of the anode or the cathode can be obtained by using the method for preparing the laminated structure according to the embodiments of the present disclosure.

The method for preparing the laminated structure is described with reference to the specific embodiments below.

EMBODIMENT ONE

A method for preparing an LED (Light Emitting Diode), which includes the following steps:

providing a top emitting LED, the top emitting LED at least includes a bottom electrode and a top electrode which are oppositely arranged, and a luminescent layer arranged between the bottom electrode and the top electrode, an encapsulation layer is prepared on the top electrode.

A first zinc oxide layer is prepared on the top electrode by using an ink-jet printing or spin-coating method, the size of the zinc oxide nano-particles is smaller than 5 nanometers, and the thickness of the film layer is between 10-30 nm;

vapor evaporating an aluminum layer with a thickness of 10-20 nanometers on the first zinc oxide layer;

ink-jet printing or spin-coating a second zinc oxide layer with a thickness of 10-20 nanometers on the aluminum layer; and performing a heat treatment process on the obtained laminated structure at a temperature of 100° C.-140° C. for 0.5-2 hours, forming $Al_2O_3$ barrier layer between the zinc oxide layer and the aluminum layer, thereby forming a laminated structure of $ZnO/Al_2O_3/ZnO$.

EMBODIMENT TWO

A method for preparing LED (Light Emitting Diode), which includes the following steps:

providing a top emitting LED, the top emitting LED at least includes a bottom electrode and a top electrode which are oppositely arranged, and a luminescent layer arranged between the bottom electrode and the top electrode, an encapsulation layer is prepared on the top electrode.

A first zinc oxide layer is prepared on the top electrode by using an ink-jet printing or a spin-coating method, the size of the zinc oxide nano-particles is smaller than 5 nanometers, and the thickness of the film layer is between 10-30 nm;

vapor evaporating a first aluminum layer with a thickness of 10-20 nanometers on the first zinc oxide layer;

ink-jet printing or spin-coating a second zinc oxide layer with a thickness of 20-40 nanometers on the first aluminum layer;

vapor evaporating a second aluminum layer with a thickness of 10-20 nanometers on the second zinc oxide layer;

ink-jet printing or spin-coating a third zinc oxide layer with a thickness of 10-20 nanometers on the second aluminum layer; performing a heat treatment process on the obtained laminated structure at a temperature of 100° C.-140° C. for 0.5-2 hours, forming $Al_2O_3$ barrier layer between the zinc oxide layer and the aluminum layer, and thereby forming a laminated structure of $ZnO/Al_2O_3/Al/Al_2O_3/ZnO/Al_2O_3/Al_2O_3/ZnO$.

EMBODIMENT THREE

A method for preparing LED (Light Emitting Diode), which includes the following steps:

providing a top emitting LED, the top emitting LED at least includes a bottom electrode and a top electrode which are oppositely arranged, and a luminescent layer arranged between the bottom electrode and the top electrode, an encapsulation layer is prepared on the top electrode.

A first molybdenum oxide layer is prepared on the top electrode by using an ink-jet printing or a spin-coating method, the size of the zinc oxide nano-particles is smaller than 5 nanometers, and the thickness of the film layer is between 10-30 nm;

vapor evaporating a first silver layer with a thickness of 10-20 nanometers on the first molybdenum oxide layer;

ink-jet printing or spin-coating a second molybdenum oxide layer with a thickness of 20-40 nanometers on the first silver layer;

vapor evaporating a second silver layer with a thickness of 10-20 nanometers on the second molybdenum oxide layer;

ink-jet printing or spin-coating a third molybdenum oxide layer with a thickness of 10-20 nanometers on the second silver layer;

performing a heat treatment process on the obtained laminated structure at a temperature of 100° C.-140° C. for 0.5-2 hours, forming $A_gO$ barrier layer between the molybdenum oxide layer and the silver layer, thereby forming a laminated structure of $M_OO/Ag_2O/Ag/Ag_2O/M_OO/Ag_2O/Ag/Ag_2O/M_OO$.

EMBODIMENT FOUR

A method for preparing an LED (Light Emitting Diode), which includes the following steps:

providing a top emitting LED, the top emitting LED at least includes a bottom electrode and a top electrode which are oppositely arranged, and a luminescent layer arranged between the bottom electrode and the top electrode, an encapsulation layer is prepared on the top electrode.

A first zinc oxide layer is prepared on the top electrode by using an ink-jet printing or spin-coating method, the size of the zinc oxide nano-particles is smaller than 5 nanometers, and the thickness of the film layer is between 10-30 nm;

vapor evaporating a magnesium layer with a thickness of 10-20 nanometers on the first zinc oxide layer;

ink-jet printing or spin-coating a second zinc oxide layer with a thickness of 10-20 nanometers on the magnesium layer; and performing a heat treatment process on the obtained laminated structure at a temperature of 100° C.-140° C. for 0.5-2 hours, forming a magnesium oxide barrier layer between the zinc oxide layer and the aluminum layer, thereby forming a laminated structure of ZnO/MgO/Mg/MgO/ZnO/MgO/Mg/MgO/ZnO.

As stated above, the aforesaid embodiments are only intended to explain but not to limit the technical solutions of the present disclosure. Although the present disclosure has been explained in detail with reference to the above-described embodiments, it should be understood by the ordinary skilled one in the art that, the technical solutions described in each of the embodiments mentioned above can still be amended, or some technical features in the technical solutions may be replaced equivalently; these amendments or equivalent replacements, which doesn't cause the essence of corresponding technical solution to be broken away from the spirit and the scope of the technical solution in various embodiments of the present disclosure, should all be included in the protection scope of the present disclosure.

What is claimed is:

1. A laminated structure, at least comprising one laminated unit, wherein the laminated unit comprises a first metal oxide layer and a second metal oxide layer which are oppositely arranged, and a third metal layer arranged between the first metal oxide layer and the second metal oxide layer, and a third metal oxide film is respectively formed between the first metal oxide layer and the third metal layer, and between the second metal oxide layer and the third metal layer, wherein a third metal in the third metal layer and the third metal oxide film is capable of reacting with oxygen to form a third metal oxide.

2. The laminated structure according to claim 1, wherein the third metal oxide film is prepared by reaction of a first metal oxide in the first metal oxide layer and the third metal layer; and/or, the third metal oxide film is prepared by reaction of a second metal oxide in the second metal oxide layer and the third metal layer.

3. The laminated structure according to claim 1, wherein the first metal oxide layer has a thickness of 10-30 nanometers; and/or the second metal oxide layer has a thickness of 10-20 nanometers; and/or the third metal layer has a thickness of 10-20 nanometers; and/or the third metal oxide film has a thickness of 2-5 nanometers.

4. The laminated structure according to claim 1, wherein the first metal oxide layer is selected from a nano-metallic oxide and/or a doped nano-metallic oxide; and/or a material of the second metal oxide layer is selected from the nano-metallic oxide and/or the doped nano-metallic oxide; and/or the third metal layer and a third metal in the third metal oxide film are selected from at least one in a group consisting of aluminum, magnesium, and silver.

5. The laminated structure according to claim 4, wherein a material of the first metal oxide layer is selected from at least one in a group consisting of nano-zinc oxide, nano-nickel oxide, doped nano-nickel oxide, nano-molybdenum oxide, and doped nano-molybdenum oxide; and/or a material of the second metal oxide layer is selected from at least one in a group consisting of nano-zinc oxide, doped nano-zinc oxide, nano-nickel oxide, doped nano-nickel oxide, nano-molybdenum oxide and doped nano-molybdenum oxide.

6. The laminated structure according to claim 4, wherein the metal oxide in the first metal oxide layer is identical to the metal oxide in the second metal oxide layer.

7. The laminated structure according to claim 4, wherein a doped material in the doped nano-metallic metal oxide is selected from a metal that can react with oxygen to generate a metal oxide having water oxygen battier capability.

8. The laminated structure according to claim 7, wherein the doped material in the doped nano-metallic metal oxide is selected from at least one in a group consisting of magnesium, aluminum, manganese and silver.

9. The laminated structure according to claim 1, wherein a size of each metal oxide nano-particle in the first metal oxide layer is smaller than 5 nanometers; and/or a size of each metal oxide nano-particle in the second metal oxide layer is smaller than 5 nanometers.

10. The laminated structure according to claim 1, wherein the laminated structure comprises 1-10 repeatedly arranged laminated units.

11. The laminated structure according to claim 10, wherein the laminated structure comprises at least 3 repeated laminated units, when a moisture permeability of a encapsulated device is $1\times10^{-6}$ g/m²/day.

12. A method for preparing a laminated structure, wherein the laminated structure comprises: at least one laminated unit, the laminated unit comprises a first metal oxide layer and a second metal oxide layer which are oppositely arranged, and a third metal layer arranged between the first metal oxide layer and the second metal oxide layer, and a third metal oxide film is respectively formed between the first metal oxide layer and the third metal layer, and between the second metal oxide layer and the third metal layer, the method for preparing the laminated structure comprises following steps of:

providing a substrate, preparing the first metal oxide layer on the substrate, preparing the third metal layer on the first metal oxide layer, and preparing the second metal oxide layer on the third metal layer, thereby obtaining a prefabricated laminated unit; and performing a heat treatment process on the prefabricated laminated unit to prepare the laminated unit, wherein the heat treatment process on the prefabricated laminated unit is performed under a temperature condition of 100° C.-140° C., and a time duration of the heat treatment is between 0.5-2 hours.

13. The method according to claim 12, further comprising a step of: repeatedly preparing the third metal layer and the third metal oxide film layer on a surface of at least one metal oxide layer of the prefabricated laminated unit, and performing the heat treatment process on the obtained laminated structure.

14. The method according to claim 13, wherein the metal oxide layer which is configured to repeatedly prepare the third metal layer and the third metal oxide film has a thickness of 20-40 nanometers in the step of repeatedly preparing the third metal layer and the third metal oxide film on the surface of at least one metal oxide layer of the prefabricated laminated unit.

* * * * *